United States Patent [19]

Kawahara et al.

[11] Patent Number: 5,060,084
[45] Date of Patent: Oct. 22, 1991

[54] SINGLE SUBSTRATE SEMICONDUCTOR DEVICE FOR IMAGE SENSING AND PRINTING

[75] Inventors: Yukito Kawahara; Satoshi Machida; Hiroshi Mukainakano; Masato Higashi, all of Tokyo, Japan

[73] Assignee: Seiko Instruments Inc., Japan

[21] Appl. No.: 289,185

[22] Filed: Dec. 23, 1988

[30] Foreign Application Priority Data

Dec. 29, 1987 [JP] Japan .................. 62-332504

[51] Int. Cl.⁵ .......................................... H04N 1/024
[52] U.S. Cl. ..................... 353/472; 358/482
[58] Field of Search .................. 358/482, 472

[56] References Cited

U.S. PATENT DOCUMENTS

| | | | |
|---|---|---|---|
| 4,466,020 | 8/1984 | O'Connell | 358/482 |
| 4,549,223 | 10/1985 | Ozawa | 358/482 |
| 4,636,813 | 1/1987 | Mego et al. | 346/76 PH |
| 4,706,128 | 11/1987 | Tanioka et al. | 358/472 |
| 4,724,490 | 2/1988 | Tanioka | 358/471 |

FOREIGN PATENT DOCUMENTS

| | | |
|---|---|---|
| 0246481 | 11/1987 | European Pat. Off. . |
| 3339256 | 5/1984 | Fed. Rep. of Germany . |
| 56-39675 | 4/1981 | Japan .................. 358/472 |

OTHER PUBLICATIONS

Ire Wescon Convention Record, vol. 29, No. 11/1, Nov. 1985, "Development of Thinfilm High Speed Thermal Head for Line Printing", Y. Nishiguchi, pp. 1-11.

Primary Examiner—Edward L. Coles, Sr.
Attorney, Agent, or Firm—Bruce L. Adams; Van C. Wilks

[57] ABSTRACT

A semiconductor device for image sensing and printing comprises an integrated circuit composed of a single semiconductor substrate on which are integrated a linear array of phototransistors, driving circuits and control circuits. The control circuits are operable in a read mode for processing output signals from the phototransistors to enable transmission thereof to an external device and are operable in a print mode for processing inputted image data signals to produce printing signals which are applied to the driving circuits for use in driving an external printing device.

19 Claims, 3 Drawing Sheets

SINGLE SUBSTRATE SEMICONDUCTOR DEVICE FOR IMAGE SENSING AND PRINTING

BACKGROUND OF THE INVENTION

(1) Field of the Invention

The present invention relates to a semiconductor device suitable for use in apparatuses providing input-/output functions for characters and graphics such as a facsimile apparatus and word processor.

(2) Description of the Related Art

An information processing apparatus capable of reading characters and graphics information, such as image data and then print out such data has been recently put into practical use in the form of a facsimile apparatus (hereinafter referred to as only FAX) and word processor. These prior art apparatuses usually comprise: photosensors to convert image data into electrical signals; logic circuits for processing and controlling the output signals of the photosensors; printing cells for printing the printing data given onto a determined recording medium; and driving circuits for driving the printing cells in accordance with the printing data. At the present time the above hardware is built separately and then built into a case.

With the extensive use of such apparatuses, the present invention focuses on a smaller and lower cost apparatus. Therefore the integration of a composite structure comprising these respective structural elements must be considered.

SUMMARY OF THE INVENTION

It is an object of the present invention to provide a semiconductor device that makes possible a further reduction in the size and cost of the FAX apparatus and word processor, etc.

In order to solve the above-mentioned problems, according to the present invention, the semiconductor device is comprised of: a plurality of photosensor cells for reading image data; driving circuit means or printing means for driving printing cells; and control circuit means for controlling the driving circuit means in response to printing data and processing output signals from the photosensor cells. The photosensor cells, driving circuit means and control circuit means are integrated circuits formed on a single substrate.

With a semiconductor device formed on a single substrate, the image data then can be converted into electrical data by the photosensors, with the converted data then being processed and outputted to external circuits. Meanwhile, at the same time the semiconductor device remains responsive to the reception of printing data. After receiving it, the device drives a printing device, such as a thermal head, through the use of the driving circuit.

DESCRIPTION OF THE PREFERRED EMBODIMENTS

The present invention will be explained in detail on the basis of the embodiment shown in the figure.

According to the present invention, a semiconductor device comprises, as an integrated circuit on a single substrate: a plurality of photosensor cells to read image data such as characters and figures; a plurality of driving cells for respectively driving a plurality of printing cells to print determined images; and control circuits for controlling the photosensor cells and driving circuit.

Figure 1:
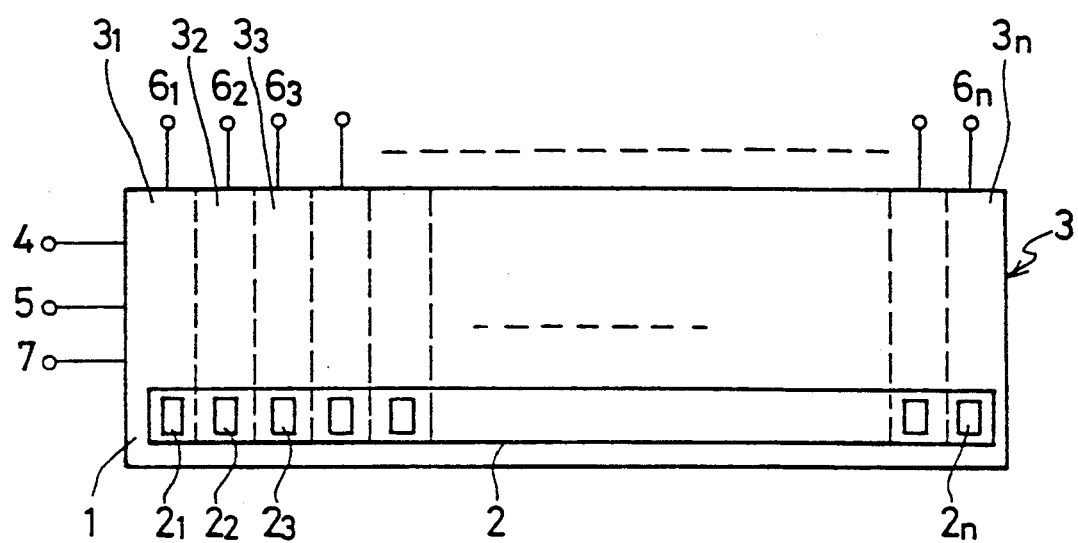
FIG. 1 is a schematic diagram of an embodiment of an image sensor to which the present invention is applied.

FIG. 1 is an embodiment wherein a semiconductor device of the present invention is applied to the image sensor of a FAX apparatus, etc.

An image sensor 1 is structured by forming line image sensors 2 for n-bit as a part of an integrated circuit semiconductor device, described later, on a single semiconductor substrate and the photosensor cells $2_1, 2_2, \ldots, 2_n$ forming the line image sensor 2 are respectively arranged within the unit blocks $3_1, 3_2, \ldots, 3_n$ arranged to form lines on the semiconductor substrate 3.

The unit blocks $3_1, 3_2, \ldots, 3_n$ have almost the same structure. So only unit block $3_1$ is shown in detail in FIG. 2.

Figure 2:
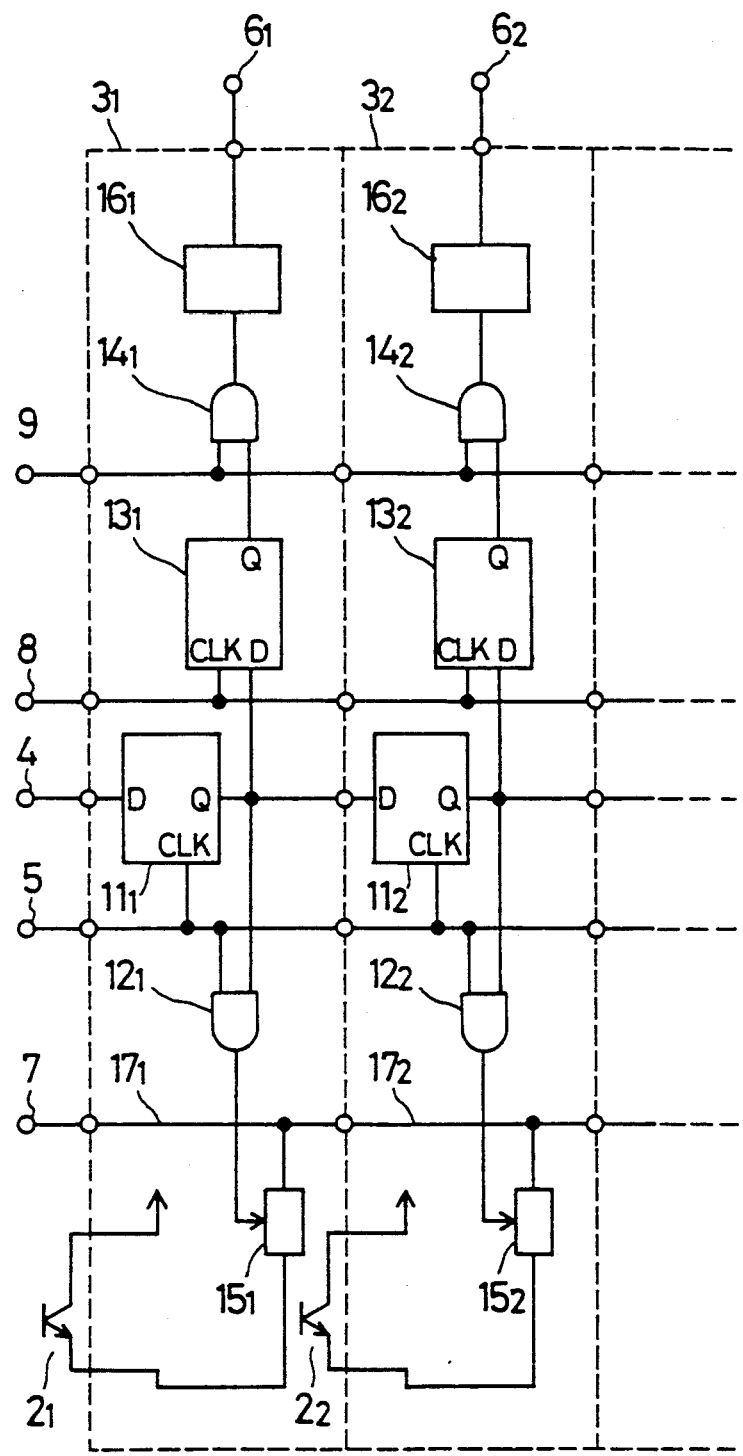
FIG. 2 is a circuit diagram indicating a structure of the unit block shown in FIG. 1.

In FIG. 2, $3_1, 3_2, \ldots$ are unit blocks respectively and each circuit of unit block $3_1$, for example, is connected as explained hereunder. The Q output terminal of a D type flip-flop circuit (hereinafter abbreviated as FF) $11_1$ is connected to the D input terminal of latch circuit $13_1$, while an external latch strobe terminal 8 is connected to the clock input terminal (CLK) of the latch circuit. The Q output terminal of the latch circuit is connected to one of the input terminals of enable gate $14_1$. The other input terminal of enable gate $14_1$ is connected to the external enable terminal, 9. The output terminal of the enable gate $14_1$ is connected to the input terminal of the drive terminal $16_1$, while the output terminal of the driving cell $16_1$ is connected to the external driver output terminal $b_1$. On the other hand, the Q output terminal of the FF $11_1$ is also connected to one of the input terminals of the AND gate $12_1$. The other input terminal of the AND gate $12_1$ is connected to the clock input terminal (CLK) of FF $11_1$. The output terminal of the AND gate $12_1$ is connected to the control terminal of the transfer gate $15_1$. The output terminal of photosensor cell $2_1$ is connected to the input terminal of the transfer gate $15_1$. Moreover, the output terminal of the transfer gate is connected to the external terminal 7 through the common output line $17_1$.

A plurality of unit blocks are connected to form the circuit diagram of the present invention. Namely, the FF is connected so that it corresponds to a single stage of a shift register. The D input of FF of unit block $3_1$ in the first stage is connected to the data input terminal 4. Moreover, the common output line i.e. $17_1, 17_2$, etc. of each unit block is connected to the same potential as the external terminal 7. The clock input terminal of each FF is connected to a common external clock input terminal 5, while the clock input terminal of each latch circuit is connected to a common latch strobe terminal 8 a common enable terminal 9 is connected to the common input terminal of each enable gate.

With these electrical connections, the driving cells $16_1, \ldots, 16_n$ form a driving circuit, although not illustrated, which drives the printing cells such as a thermal head, etc. The photosensor cells $2_1, \ldots, 2_n$ form the line image sensor. The other circuits $11_1 \ldots 11_n, 12_1 \ldots 12_n,$ $13_1 \ldots 13_n$, $14_1 \ldots 14_n$, $15_1 \ldots 15_n$, respectively form the control circuits.

The operations involved in driving the printing cells of the present invention will now be explained. The printing data is synchronized with the clock signal of the shift register formed by FFs $11_1 \ldots 11_n$ which are connected to the data input terminal 4 allowing the data to be transferred to each block. The printing data transferred to each block appears at the Q output of each FF. Inputting a control signal "ON" to the latch strobe terminal 8 holds such data until the printing data can be fetched from each block to the respective latch. After each the latch circuit fetches its data, the control signal "OFF" is input to the latch strobe terminal, establishing a condition to input printing data to each FF.

If an external printing cell, for example, a heat generating cell such as a thermal head is to be driven on the basis of the data fetched by the latch circuits, the control signal "ON" is input to the enable terminal 9 in order to operate the driving cell through the enable gate $14_n$ and drive the heat generating cell through the driver output terminal which is connected to the output terminal of each driving cell. When the printing is completed the enable gate and the driving cell are turned OFF further resulting in the driving of the heat generating cell to be completed. New data can then be printed by repeating these operations.

Next, the operation of an device functioning as the image sensor will be explained. First the control operations for serially extracting the n-bit parallel data obtained by the line image sensor 2 with an analog signal from external terminal 7 will be explained. The n-bit serial data of (1000 . . . 0) is applied to terminal 4 which is the data input terminal of the shift register. It is then sequentially read to each stage of the shift register in synchronization with the clock by applying a continuous clock pulse to the clock terminal 5 thereby allowing the transfer gates $15_1, 15_2, \ldots, 15_n$ to be sequentially turned ON. The image data obtained by the photosensor cells $2_1, 2_2, \ldots, 2_n$ is then sequentially output from the output terminal onto the common output line $17_n$. During operation of the image sensor an "OFF" signal is continuously applied to both the latch strobe 8 and enable terminal 9 so that the driving cell on the printing side of the device cannot turn ON.

According to the structure described, a driving circuit for driving the printing cell, control circuits to control these and an image sensor 2 are structured on the same substrate, thereby realizing a reduction in size over the prior art. Moreover, since these elements are all formed by semiconductor elements, these can be formed as an integrated circuit on a single crystal substrate, thus resulting in a cost reduction through the use of a simplified manufacturing process and providing a device that is small in size and low in cost.

Figure 3:
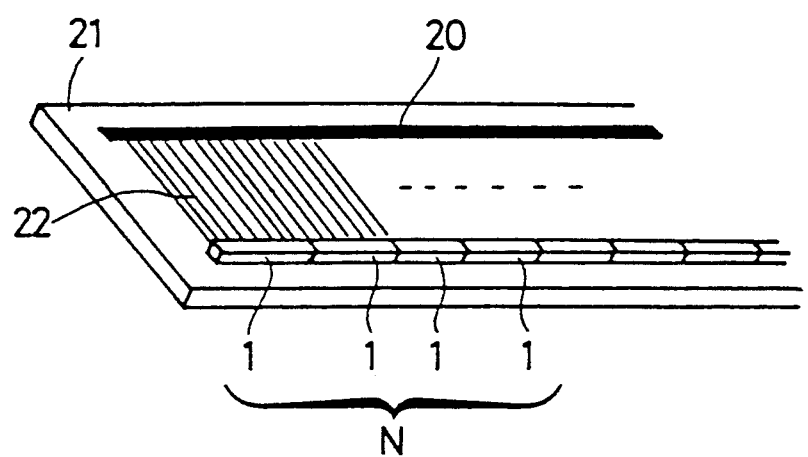
FIG. 3 is a perspective view indicating an example in which the image sensor shown in FIG. 1 is loaded on the thermal head.

FIG. 3 shows an example of the device in which N image sensors 1, each shown in FIG. 1, are provided, in series, on a ceramic substrate 21 forming a heat generating cell array 20 for printing and driving output terminals $6_1 \ldots 6_n$ of each image sensor. Each 1 image sensor is connected to a heat generating cell of the heat generating array 20 by wire group 22 on a one to one basis.

In the case of the device, shown in FIG. 3, the heat generated by the heat generating cell array 20 is transmitted to the image sensors 1 and as a result the sensors temperature becomes higher than the ambient temperature. When the of image sensor outputs binary signals representing only thick and thin lines as in an ordinary facsimile apparatus, no problem is posed by a photodiode which produces a heavy leakage current when subjected to high temperature conditions when used as the image sensor. However, in case additional outputs representing various thicknesses of thick and thin lines are required to make a multilevel display these, distinctive, thick and thin images can be read due to extremely small increases in dark current output by employing the floating base type of phototransistors. Moreover, a variety of elements may be used as the driving cell with an open, drain type, n-channel MOS transistor formed on a P type substrate being the most suitable.

According to the present invention, the driving and control circuit portions are manufactured, not only by the same semiconductor integrated circuit process, but are formed on the same substrate as the image sensor. Therefore, the size of the device can be reduced and the same manufacturing process can be used. Accordingly, manufacturing costs can be remarkably reduced in comparison with processes and change that manufacturing such circuit portions separately.

What is claimed is:

1. A semiconductor device of the integrated circuit type, comprising:
   a single semiconductor substrate;
   a plurality of phototransistors formed on the semiconductor substrate for reading image data and producing corresponding output signals;
   driving circuit means formed on the same semiconductor substrate for driving external printing cells; and
   control circuit means formed on the same semiconductor substrate for controlling the driving circuit means in response to printing data and for processing the output signals from the phototransistors.

2. A semiconductor device as claimed in claim 1; wherein the plurality of phototransistors are disposed to form a line image sensor.

3. A semiconductor device as claimed in claim 1; wherein each phototransistor is comprised of a phototransistor of the floating base type.

4. A semiconductor device formed on a single semiconductor substrate, comprising:
   photosensing means formed on the semiconductor substrate for reading image data and for converting the read image data into corresponding electrical signals;
   driving means formed on the semiconductor substrate for driving an external printing means; and
   control means formed on the semiconductor substrate for processing the electrical signals from the photosensing means and for controlling the driving means.

5. A device according to claim 4; wherein the photosensing means comprises a plurality of phototransistors for reading image data.

6. A device according to claim 5; wherein the plurality of phototransistors comprises a line image sensor.

7. A device according to claim 5; wherein each phototransistor comprises a floating base type phototransistor.

8. A semiconductor integrated circuit comprising: a single semiconductor substrate; a plurality of photosensors integrated with the semiconductor substrate for reading image data and producing corresponding output signals; control circuit means integrated with the semiconductor substrate and operable in a read mode for processing the output signals from the photosensors and operable in a print mode for processing externally applied image data signals and producing therefrom printing signals representative of the image data; and driving circuit means integrated with the semiconductor substrate and responsive to the printing signals for driving an external printing means to reproduce the image data.

9. A semiconductor integrated circuit according to claim 8; wherein the control circuit means comprises a plurality of control circuits connected to respective ones of the photosensors; and the driving circuit means comprises a plurality of driving circuits connected to respective ones of the control circuits.

10. A semiconductor integrated circuit according to claim 9; wherein the photosensors are disposed in a straight line on the semiconductor substrate.

11. A semiconductor integrated circuit according to claim 10; including in combination therewith a plurality of similar integrated circuits each formed on a separate semiconductor substrate, all of the semiconductor substrates being arranged such that the photosensors on all of the semiconductor substrates are disposed in a straight line to jointly define a line image sensor.

12. A semiconductor integrated circuit according to claim 8; wherein the control circuit means includes input terminals receptive of input signals to selectively operate the control circuit means in the read and print modes.

13. A semiconductor integrated circuit according to claim 8; wherein the control circuit means includes a read terminal to enable the output signals from the photosensors to be transmitted to an external device.

14. A semiconductor integrated circuit according to claim 8; wherein the driving circuit means includes a plurality of print terminals connectable to the external printing means.

15. A semiconductor integrated circuit according to claim 8; wherein the photosensors comprise phototransistors.

16. A semiconductor integrated circuit according to claim 8; wherein the control circuit means comprises a plurality of shift registers for temporarily storing the image data signals, a plurality of latches connected to the respective shift registers for latching the image data signals, and a plurality of gates connected to the respective latches for gating the image data signals to the driving circuit means.

17. A semiconductor integrated circuit according to claim 16; wherein the photosensors are disposed in a straight line on the semiconductor substrate.

18. A semiconductor integrated circuit according to claim 8; wherein the photosensors comprise phototransistors.

19. A semiconductor integrated circuit according to claim 8; wherein the semiconductor substrate has a pair of opposed major surfaces; the photosensors, control circuit means and driving circuit means all being integrated on one major surface of the semiconductor substrate.

* * * * *